United States Patent
Thomas

(10) Patent No.: US 12,268,025 B1
(45) Date of Patent: Apr. 1, 2025

(54) ALEFT-ISD-LTSEE{ADVANCED LOW ELECTROSTATIC FIELD TRANSISTOR USING IMPLANTED S/D AND LOW TEMPERATURE SELECTIVE EPITAXIAL EXTENSION}

(71) Applicant: Mammen Thomas, Seattle, WA (US)

(72) Inventor: Mammen Thomas, Seattle, WA (US)

( * ) Notice: Subject to any disclaimer, the term of this patent is extended or adjusted under 35 U.S.C. 154(b) by 0 days.

(21) Appl. No.: 18/663,423

(22) Filed: May 14, 2024

(51) Int. Cl.
- H01L 21/02 (2006.01)
- H10D 30/60 (2025.01)
- H10D 62/10 (2025.01)
- H10D 62/13 (2025.01)
- H10D 62/17 (2025.01)

(52) U.S. Cl.
CPC ......... *H10D 62/314* (2025.01); *H10D 30/601* (2025.01); *H10D 62/102* (2025.01); *H10D 62/116* (2025.01); *H10D 62/151* (2025.01)

(58) Field of Classification Search
None
See application file for complete search history.

(56) References Cited

U.S. PATENT DOCUMENTS

2013/0049140 A1* 2/2013 Asenov ............... H01L 29/6656
257/E21.409

* cited by examiner

*Primary Examiner* — Joseph C. Nicely
*Assistant Examiner* — Lamont B Koo

(57) ABSTRACT

Device scaling has increased the device density of integrated circuits (ICs) and reduced the cost of circuits. Today development of new device structures, use of new materials and complex process steps are implemented to continue scaling of the semiconductor devices. The added manufacturing steps and complexity have increased cost of ICs directly impacting the implementation of IoT devices that need low cost and high yields to be successful. ALEFT-ISD-LTSEE is a device that reduces the cost while improving device performance. ALEFT-ISD-LTSEE is suitable for continued scaling of gate and channel lengths while reducing impact of random threshold variation due to discrete dopants in and around the channel by elimination of implants and high temperature processing. By creating a flat field profile at the gate by use of low temperature epitaxy as source/drain extension, the short channel effects, and the impact of line edge variations of the gate are also reduced.

19 Claims, 2 Drawing Sheets

Embodiment

ALEFT-SLTEE {Advanced Low Electrostatic Field Transistor using Selective Low Temperature Epitaxial Extension with metal cover}

Cross section of Advanced Low Electrostatic Field Transistor

Note: shallow S/D implanted using sacrificial spacer

ALEFT-ISD-LTSEE {Advanced Low Electrostatic Field Transistor (LEFT) Using implanted *S/D* and Selective Low Temperature Epitaxial Extension{ISD-LTSEE)}

Next Generation Low Electrostatic Field Device

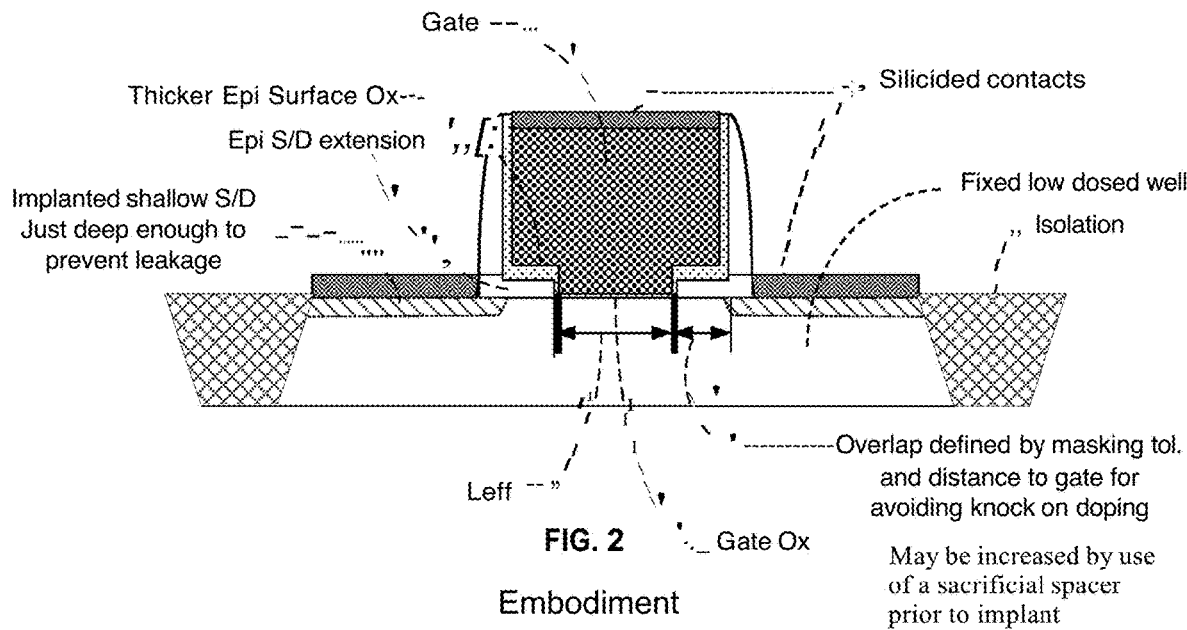

Labels on FIG. 2:
- Gate
- Thicker Epi Surface Ox
- Epi S/D extension
- Implanted shallow S/D Just deep enough to prevent leakage
- Silicided contacts
- Fixed low dosed well
- Isolation
- Leff
- Gate Ox
- Overlap defined by masking tol. and distance to gate for avoiding knock on doping
- May be increased by use of a sacrificial spacer prior to implant

FIG. 2 Embodiment

Typical Process Flow (for fig 2)   Table 1

| Process | Mask | Implant |
|---|---|---|
| 1. Start wafer & shallow trench Isolation | 1 | 0 |
| 2. Constant Well implants | 2 | 2 |
| 3. Grow sac Ox Nitride and deposited oxide | 0 | 0 |
| 4. Mask gate ( leave Ox/Nil/Ox); Etch oxide/nil/Oxide clean surface | 1 | 0 |
| 5. Mask/ cover P regions, selective N+ Epi | 1 | 0 |
| 6. Mask cover N regions, selective P+ Epi | 1 | 0 |
| 7. Thin Epi Side Oxide growth- Deposit Nitride layer- an-iso etch | 0 | 0 |
| 8. Thick Oxidation of Epi surface | 0 | 0 |
| 9. Etch off Oxide Nitride and sac oxide - also nitride and oxide from side | 0 | 0 |
| 10. Grow(dep) gate ox/ side wall oxide ( two thickness) | 1 | 0 |
| 11. Deposit gate material-Mask Etch gate with overlap | 2 | 0 |
| 12. Mask Isolation regions and an-iso etch oxide-clear Epi | 1 | 0 |
| 13. Msk and Implant shallow S/D through EPI & Anneal | 2 | 2 |
| 14. Deposit spacer & isotropic etch to space off silicide from implant edge | 0 | 0 |
| 15. Silicide Contacts | 0 | 0 |
| 16. Deposit ILD, Planarize, contact mask, contact etch | 1 | 0 |
| 17. Contact and multi level Metalization | - | - |
| Total | 13 | 4 |

FIG.3

ALEFT-ISD-LTSEE{ADVANCED LOW ELECTROSTATIC FIELD TRANSISTOR USING IMPLANTED S/D AND LOW TEMPERATURE SELECTIVE EPITAXIAL EXTENSION}

FIELD OF INVENTION

This invention relates to semiconductor device and processing of the same with low or reduced electric fields reducing short channel issues and threshold voltage variability for ensuring high quality and characteristics of operation of miniaturized devices.

BACKGROUND OF THE INVENTION AND THE NEED FOR THE INVENTION

Over the past decade or more scaling of the semiconductor devices has been following Moore's law. But the scaling is bumping against issues of high levels of doping, short channel effects, and threshold variations due to random dopant distribution near and under the gate, that limit the capabilities, quality and characteristics of these small devices.

Device scaling has been instrumental in increasing the device density of integrated circuits (ICs) and reducing the cost of these circuits. Today development of new device structures, use of new materials and implementation of complex process steps have to be considered to continue scaling of the semiconductor devices. The number of steps and cost of each step of processing ICs have also increased with the complexity increase. These process and technology innovations come with associated cost of circuit implementations.

It will hence be optimum if a simpler device structure with simpler processing (with reduced number of steps) that is closer to the original simple process flows in the fab, while having improved short channel effects is made available to continue the scaling of devices.

The currently filed and pending LEFT-ISD-LTSEE {Low Electrostatic Field Transistor (LEFT) Using implanted S/D and thin (typically having a thickness of the order of 2 to 12 nm) Selective Low Temperature Epitaxial Extension (ISD-LTSEE)} technology (the typical low temperature selective epitaxial growth or deposition is in the temperature range of 300-650 degree centigrade) is one such, that allows scaling of devices without undue stress on lithography to about 20 nm (existing masking capability in the range of 15 to 35 nm) with lower cost of masking and manufacture.

The technology also provides for low temperature processing of the device, especially after the low temperature selective epitaxial growth or deposition (typically the post processing after selective epitaxial growth or deposition is also controlled in the temperature range of 300-650 degree centigrade) which reduces or eliminates the diffusion of the dopants within and from the processed doped layers of the transistor.

The current sweet-spot for low cost device manufacture is 28 to 20 nm especially for IoT products that are very sensitive to cost of product which is limited by the manufacturing cost. What is needed today is to find a way to scale the devices without increasing the process complexity and cost unduly. This is what is being proposed in the current application.

The Inventive Idea

The current application ALEFT-ISD-LTSEE {Advanced Low Electrostatic Field Transistor (LEFT) using implanted S/D and Selective Low Temperature Epitaxial Extension (ISD-LTSEE)} is to allow the gate/channel length of transistors to be scaled below the 20 nm level, even down to 2 nm with appropriate masking without undue increase in cost of masking and manufacture. The ALEFT-ISD-LTSEE technology builds on the currently patent applied for LEFT-ISD-LTSEE technology by enabling one mask, the gate mask to be used on a planar surface to enable channel length to be scaled without major impact on the rest of the process.

DESCRIPTION OF FIGURES

FIG. 2—is an exemplary and non-limiting cross sectional view of a second exemplary and preferred embodiment of the ALEFT-ISD-LTSEE {Advanced Low Electrostatic Field Transistor (LEFT) Using implanted S/D and Selective Low Temperature Epitaxial Extension (ISD-LTSEE)} as per the invention.

FIG. 3—Table 1—is an exemplary and non-limiting process flow for implementing the first embodiment of the invention shown in FIG. 2.

Figure 1:
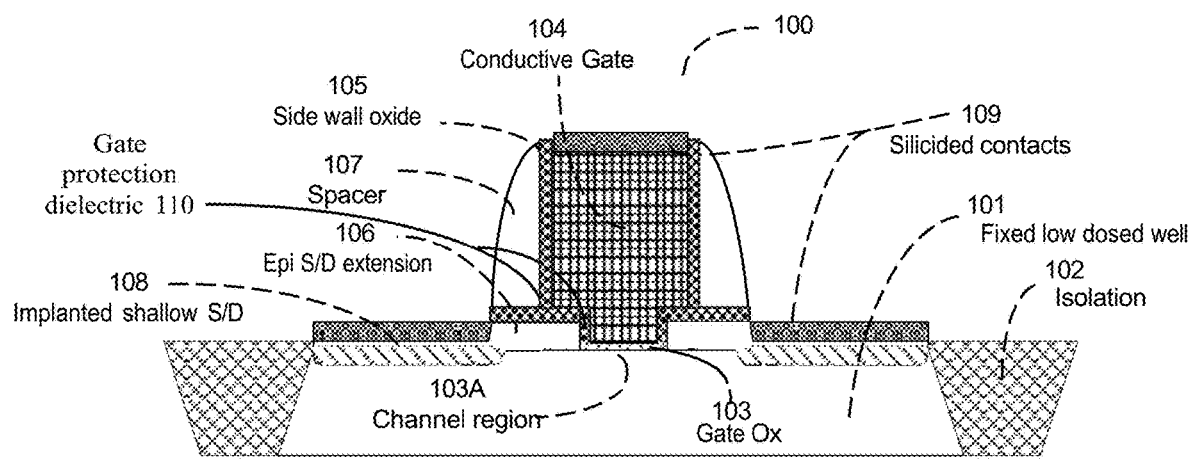
FIG. 1—is an exemplary and non-limiting cross sectional view of an embodiment of the current invention showing the set of structural elements of the ALEFT-ISD-LTSEE {Advanced Low Electrostatic Field Transistor (LEFT) Using implanted S/D and Selective Low Temperature Epitaxial Extension (ISD-LTSEE)} Transistor/Device per the invention.

DETAILED DESCRIPTION OF THE ALEFT-ISD-LTSEE {ADVANCED LOW ELECTROSTATIC FIELD TRANSISTOR (ALEFT) USING IMPLANTED S/D AND LOW TEMPERATURE SELECTIVE EPITAXIAL EXTENSION (ISD-LTSEE)}

Device scaling has increased the device density of integrated circuits (ICs) and reduced the cost of circuits. Today development of new device structures, use of new materials and implementation of complex process steps are implemented to continue scaling of the semiconductor devices. The added manufacturing steps and complexity have resulted in increased cost of ICs directly impacting the implementation of IoT devices that need low cost and high yields to be successful.

ALEFT-ISD-LTSEE is a device that reduces the cost while improving device performance. ALEFT-ISD-LTSEE is suitable for sub 20 nm sizes (typically 2-18 nm gate lengths) where random threshold variation due to impact of discrete dopants in and around the channel becomes a critical consideration. By using ALEFT-ISD-LTSEE the random threshold variation due to impact of discrete dopants in and around the channel is reduced by elimination of a number of implants and drives. Also, by having a flat field profile at and around the gate, by use of low temperature epitaxy as source/drain extension, the short channel effects, and the impact of line edge variations of the gate are also reduced.

The currently disclosed A LEFT-ISD-LTSEE structure builds on the technology and processes used for patent pending LEFT-ISD-LTSEE transistor to achieve smaller gate lengths and associated channel sizes (gate/channel shrinkage). Since the process and technology of ALEFT-ISD-LTSEE are built on the original LEFT-ISD-LTSEE process and technology, it is able to bring with it all the advantages of the LEFT-ISD-LTSEE device A simplified device technology that can be implemented with a reduced number of masking and process steps is proposed for the ALEFT-ISD-LTSEE based on the prior disclosed LEFT-ISD-LTSEE. The device structure reduces the effect of short channel effects on the operation of the devices developed and allow the devices to be scaled with minimum increase in device complexity. The processing is made much simpler by reduction or elimination of implant steps and associated high temperature activation/drives but uses new available technology with lower temperature processing and low temperature selective epitaxial depositions. The replacement/elimination of critical implant around the gate of the device and the associated activation steps reduce uncertainty of dopant location relative to the channel and help reduce the associated variability of device characteristics. The reduction in short channel effects and reduction in variability of device characteristics enable the devices to move down the device scaling and integration path. The disclosed device and technology are usable for device processing on planar semiconductor wafers, on Silicon on Insulator (SOI) and even for unique device structures like FinFET at and below the 20 nm device dimensions.

FIG. 1 shows an exemplary cross section of the ALEFT-ISD-LTSEE transistor and the structural details. FIG. 2 shows embodiment(s) of the invention. The embodiment uses the gate-structural width of the gate comprising conductive gate (104) plus the side wall oxide (105) and where needed a sacrificial spacer to implement the thin low temperature selective epitaxial source and drain extensions (106). These low temperature selective epitaxial source and drain extensions (106) are enabled with the required variations in selective epitaxial thickness adjustment and insitu doping as required to adjust the S/D resistance of the finished ALEFT ISD-SEE (100) transistor device. The use of the sacrificial spacer is only needed when the spacing of the channel from the shallow implanted Source and drain implemented using the structural width of the gate are insufficient to eliminate the knock on dopants from the implant from influencing the channel characteristics. By removing the implants from the vicinity of the channel the influence of the vertical field at the channel edge, influencing/controlling the channel is reduced. Typically, due to the flat nature of the fields around the gate the electrostatic fields perpendicular to the plane of the gate dielectric to substrate interface are less than $5\times10^5$ volts/cm over more than 50% of the channel area under all operating conditions.

The ALEFT-ISD-LTSEE transistor (100) gate/channel region (103A) is defined by the selective low temperature epitaxial growth. The gate region prior to the selective epitaxial growth is masked on the flat wafer surface having an oxide/Nitride/Oxide cover, to leave the the original oxide/Nitride/Oxide layer intact in the gate region such that the selective epitaxial growth does not happen in the gate region. The grown selective epitaxial extension is then covered by a dielectric such that the epitaxial extensions have a thicker protective dielectric layer on the surface that is thicket than the gate oxide to be grown in the gate region. The oxide/nitride/oxide layer in the gate/channel region (103A) is removed and a gate dielectric is grown or deposited there. The conductive gate electrode (104) is deposited, and the gate structure is etched and the side walls oxidized. To complete the exemplary gate structure comprising the conductive gate electrode (104) over the gate dielectric (103) with protected side walls, protected by dielectric (105). The gate process defined enable the gate definition to be done on a flat semiconductor surface and the gate to be defined by the low temperature selective epitaxial growth of the source and drain extensions (106).

FIG. 3—Table 1 associated with the first exemplary embodiment shown in FIG. 2 provides an exemplary process flow for manufacture of the ALEFT-ISD-LTSEE transistor of embodiment 1.

The process flow of FIG. 3—Table 1 also compares the prior art process with the process for ALEFT-ISD-LTSEE transistor to identify the number of steps, implants and thermal diffusions eliminated in the current process.

The structure and process allow either silicon gate or metal gate technology to be implemented. As an exemplary process, the silicon gate process is described. If the silicon gate is considered as a sacrificial gate, the technology can be adapted for metal gate. Further the technology is also implementable on SOI wafers with equal ease.

FIG. 2 shows the completed exemplary structure(s) of the advanced low electrostatic field device (ALEFT) using implanted S/D and a thin low temperature selective Epitaxial Extension (ISD-LTSEE), the ALEFT ISD-SEE (100) transistor device as per the preferred embodiment of the invention. The exemplary details of manufacture of the embodiment is provided by the processing description in the FIG. 3—table 1 as previously indicated. The ALEFD ISD-SEE (100) transistor is shown in FIG. 1 on a silicon substrate or a well (101) formed in the silicon substrate, both having a low dopant concentration. A shallow trench isolation 102 is used to define device and isolate the device from neighboring structures. The low dosed well/substrate (101) typically having a fixed dopant concentration in the range of $10^{16}$ to $1\times10^{18}$ atoms per $cm^{-3}$ forms the active region of the ALEFD ISD-SEE (100). A gate structure comprising a gate oxide (103) on semiconductor well/substrate (101) surface, with a conductive gate material (104) preferably amorphous silicon, having sidewall insulation dielectric (105) is used to control a channel region (103A) under the gate oxide (103). A shallow S/D implant (108) implanted into the semiconductor, with low penetration (typically 10 to 200 angstroms) into the well/substrate (101) provides the active Source and Drain regions (108) of the ALEFT ISD-SEE (100) transistor. A thin selective epitaxial layer grown on the surface of the substrate using low temperature epitaxial process establishes the Source extension (106) and Drain extensions (106) of the ALEFT using ISD-SEE (100) transistor. The epitaxial layer provide a vertical extension of the implanted Source and Drain regions 108 over the silicon surface. A spacer is used to define the Source and Drain extensions 106 under the spacer. The source contact, the drain contact and the gate contact areas are silicided (109) to establish good low resistance contacts to the source (108), the epitaxial source extension (106), the drain (108), the epitaxial drain extension (108) and the conductive gate electrode (104).

The Source and drain extensions 106 under the spacer 107 are used to connect the source and drain regions that include the shallow implants 108 and the selective epitaxial regions (above the shallow implants, to the channel region 103A under the gate oxide 103 that is controlled by the voltage applied to the conductive gate electrode (104). A dielectric layer (110) thicker than the gate dielectric on the epitaxial source and drain extensions (106) is used to protect the conductive gate electrode from the low temperature selective epitaxial extensions (106)

The gate dielectric (103) on the semiconductor substrate surface/well (101) surface, the low temperature epitaxial source and drain extensions (106) in contact with the substrate/well are all coplanar on the semiconductor substrate surface.

At times the thin selective epitaxial region over the shallow S/D will be completely consumed by the silicide formation. In such cases the shallow S/D implanted region (108) with overlap to the silicide contacts region will prevent leakage current from the silicided contacts (109) to the semiconductor substrate/well (101).

Use of strained silicon channel can be implemented in the above-disclosed process by adding silicon germanium or other appropriate undoped epitaxial material growth in the S/D region using and extending the use of the strain material to grow the extensions. But having reduced short channel effects will allow the gate length to be reduced substantially without undue need for strain engineering and drain engineering to achieve the needed speeds. By using undoped or low-doped epitaxial silicon as part of the substrate it is possible to achieve very high mobility for the carriers (close to intrinsic mobility) with reduced drain engineering and channel strain engineering.

Referring to Table 1.

FIG. 3—Table 1 provides a comparison of the steps required to implement P and N channel ALEFT ISD-SEE (100) transistor devices, of the first embodiment, shown in FIG. 2, on a silicon wafer. The common steps are grouped together in the table and a comparison of number of implants and masking steps required are provided. The comparison clearly shows the substantial reduction in critical process steps that are possible with the disclosed device implementation.

The post low temperature selective epitaxial extensions and the low temperature anneal/activation of the shallow source/drain implanted junctions provides almost no dopant movement from the thin selective epitaxial layer into the silicon substrate, via the contact interface from the low temperature selective source drain epitaxial extensions to the silicon substrate and the channel of the ALEFT ISD-SEE (100) transistor device.

In addition, by providing a S/D extension which is on silicon surface almost in the plain of the channel, the impact of source and drain on the channel that creates the short channel issues and the drain engineering requirements are reduced.

Also by providing non implanted Source/Drain extensions using low temperature selective Epitaxial process and a uniformly doped well, the random variation of the threshold of the device due to random placement of dopant ions in or near the channel, namely the sigma Vt of the device is reduced substantially providing the device the capability to use lower supply voltages and scale to much smaller dimensions with very limited additional effort.

One of the major items to be noted in comparing the characteristics of prior art devices on planar silicon surface with the characteristics of the ALEFT ISD-SEE (100) transistor characteristics is that the ALEFT ISD-SEE (100) transistor channels are approximately same as the masked gate length whereas the prior art devices have channel lengths defined by the extension of implanted dopant typically LDD under the gate of the devices. So, comparisons have to be done based on the channel lengths rather than the masked gate lengths.

Implementation of ALEFT ISD-SEE (100) Transistor on SOI Substrate.

Even though the implementation described is on panar silicon wafers, the process and technology are adaptable to manufacture on an SOI wafer. Using the SOI wafer enables the devices to be implemented to accept back bias for further control of Vt values.

Drain Engineering for Short Channel Effects and Strain.

Use of strained silicon channel can be implemented in the above-disclosed process by adding silicon germanium or other appropriate undoped epitaxial material growth in the S/D region using and extending the use of the strain material to grow the extensions. But having reduced short channel effects will allow the gate length to be reduced substantially without undue need for strain engineering and drain engineering to achieve the needed speeds. By using undoped or low-doped epitaxial silicon as part of the substrate it is possible to achieve very high mobility for the carriers (close to intrinsic mobility) with reduced drain engineering and channel strain engineering.

Some Advantages of the Current Disclosed Inventions Described Include:

All the advantages previously indicated for the patent pending LEFT ISD-SEE transistor (See items 1 to 13), the ALEFT ISD-SEE (100) transistor provides additional advantages indicated at item 14 and 15 below.

1. Very low electrostatic field at source and drain junctions, allowing very small planar devices to be implemented and scaling to be continued.
2. Reduced variation of threshold (sigma Vt) over the designed value due to impact of discrete dopants in and around the channel.
3. Elimination of complex Drain engineering to achieve low fields impacting the gate.
4. Reducing the number of implants drastically, thereby reducing the total steps for device implementation.
5. Use of a sacrificial spacer (similar to spacer last) technology in one implementation with selective epitaxial growth for gate length control and low series resistance.
6. Use of low temperature processing to limit diffusion of dopants and associated gate length variations.
7. Very low diffusion from Epi to ensure S/D to channel connectivity under all conditions.
8. Elimination of implants and high temperature steps for establishing critical dimensions and device characteristics reduce the process related variations of threshold (sigma Vt) due to random dopant near and in the channel.
9. Reduced number of critical masking steps.
10. Overall reduction in complexity of process with associated cost reduction.
11. Implementable on planar silicon, and SOI substrates.
12. Can be implemented using silicon or metal gate technologies.
13. Strain engineering may be implemented in the usual manner if so desired with the technology.
14. Ability to scale the gate size to much smaller dimensions, (from 20 nm to 2 nm) by using masking of the gate on flat surface and defining the gate by the low temperature selective epitaxial growth.
15. The us of thicker protection dielectric (3-10 nm), to protect the low temperature selective epitaxial Source and drain extensions from conductive gate electrode, enable reduction in the gate to S/D coupling improving device performance.

Though the process and the implementation examples have been provided for both single crystal substrate and SOI substrate the technology shown should not be construed to be limited by the examples provided. The technology with additional changes is implementable into almost any semiconductor process, including high voltage process, FinFET process etc. with appropriate changes to improve the short channel effects and speed of the devices as will be well understood by practitioners of the art. These implementations though not shown in the application are being covered by the application.

Though a silicon based process is described in the current application, it should also be not considered limiting. The technology described may be implemented effectively to reduce process complexity and improve characteristic of other semiconductor devices, with changes in process as will be well understood by practitioners of the art. Other typical semiconductors include but are not limited to 3-5 compounds, Silicon Carbide etc. where the patent can be effectively applied.

What is claimed is:

1. A transistor structure for advanced Low Electrostatic Field Transistor that enables a gate length and a corresponding length of a device channel to be defined and scaled using two self-aligned low temperature selective epitaxial extension depositions on a surface of a semiconductor substrate or on a surface of a well in the semiconductor substrate; wherein the device channel is established in the semiconductor under a gate dielectric on the surface of the semiconductor substrate or the surface of the well in the semiconductor substrate;
   wherein the use of the use of the selective epitaxial extension depositions on a surface of the semiconductor substrate or on the surface of the well in the semiconductor substrate eliminate source and drain extension implants close to or abutting the device channel;
   wherein the selective epitaxial extension depositions on the surface of the semiconductor substrate or the surface of the well in the semiconductor substrate are in contact with a shallow source/drain implant into the surface of the semiconductor substrate or the surface of the well in the semiconductor substrate; wherein the shallow source/drain implant is spaced away from the device channel; and
   wherein the selective epitaxial extension depositions also connect to the source/drain silicide contact.

2. The advanced Low Electrostatic Field Transistor of claim 1, wherein the surface of the semiconductor substrate or the surface of the well in the semiconductor substrate on which the self-aligned low temperature selective epitaxial extension depositions are done is a lightly doped surface of the semiconductor substrate or a lightly doped surface of the well in the semiconductor substrate, enabling the device channel to be established under the gate dielectric on the lightly doped surface of the semiconductor substrate or the well in the semiconductor substrate:
   wherein there are no implanted junctions abutting or adjacent to the device channel.

3. An advanced Low Electrostatic Field Transistor structure enabled by use of a low temperature selective epitaxial deposition on a lightly doped surface of a semiconductor substrate or a lightly doped surface of a well for creating a self-aligned selective epitaxial source extension and a self-aligned selective epitaxial drain extension on the lightly doped surface of the semiconductor substrate or the lightly doped surface of the well;
   wherein the spacing between self-aligned low temperature selective epitaxial deposition comprising the selective epitaxial source extension and the selective epitaxial drain extension both in contact with the lightly doped surface of the semiconductor substrate or the lightly doped surface of the well enables a gate length and a corresponding length of a device channel to be defined and scaled on the lightly doped surface of semiconductor substrate or the well.

4. The advanced Low Electrostatic Field Transistor of claim 3, spacing away a shallow implanted source and a shallow implanted drain away from the gate edges using a gate structure, in conjunction with a sacrificial spacer as a mask for enabling increased spacing, enable elimination of knock on dopant distribution close to and under the device channel under a gate dielectric on the surface of the semiconductor substrate or the well;
   wherein the gate dielectric, defined by a spacing between the self-aligned low temperature selective epitaxial depositions, that form the selective epitaxial source extension and the selective epitaxial drain extension on the surface of the semiconductor substrate or the well, the gate dielectric under laying a conductive gate electrode on the surface of the semiconductor surface or the well;
   wherein the device channel of the advanced Low Electrostatic Field Transistor underlaying the gate dielectric is controlled by a threshold voltage applied to the conductive gate electrode, forming part of the gate structure;
   the spacing away of the shallow Source and shallow drain implants resulting in the elimination of knock on dopant distribution close to and under the device channel under the gate dielectric resulting in a flat electrostatic field at the device channel enabling a control of the device channel of the advanced Low Electrostatic Field Transistor by the threshold voltage applied to the gate electrode; and
   wherein the elimination of knock on dopant distribution close to and under the device channel under the gate dielectric further reduces a threshold voltage variability introduced by a random dopant distribution; and
   wherein the elimination of knock on dopant distribution close to and under the device channel under the gate dielectric also reduces short channel effects of the advanced Low Electrostatic Field transistor.

5. The advanced Low Electrostatic Field Transistor structure of claim 4, wherein the structure comprises:
   the semiconductor substrate or the well having a lightly doped surface;
   the gate structure having the conductive gate electrode over laying the gate dielectric on the surface of the semiconductor substrate or the well and also over laying the selective epitaxial Source extension and the selective epitaxial drain extension;
   the conductive gate electrode over laying the gate dielectric, having protective dielectric on its side walls and protected from contact with the selective epitaxial Source extension and the selective epitaxial drain extension by a protective dielectric forming a gate structure of the advanced Low Electrostatic Field Transistor;
   a gate length and a device channel length of the advanced Low Electrostatic Field Transistor defined by the separation of the selective epitaxial source extension and the selective epitaxial drain extension on the surface of the semiconductor substrate or the well, the gate dielectric deposed between the selective epitaxial source extension and the selective epitaxial drain extension on the surface of the semiconductor substrate or the well;
   the device channel in the substrate, under the gate dielectric, under the conductive gate electrode;

the channel in contact with the selective epitaxial Source extension and the selective epitaxial drain extension that is on the substrate surface;

the shallow implanted source spaced away from the gate on a first side, but connected to the channel under the gate by the epitaxial source extension on the surface of the substrate, the source extension in contact with the shallow implanted source and the substrate, the source extension abutting the gate structure at a first vertical gate edge on a first side of the gate dielectric;

the shallow implanted drain spaced away from the gate on a second side opposite the first side, but connected to the channel under the gate by the epitaxial drain extension on the surface of the substrate, the drain extension in contact with shallow implanted drain and the substrate, the drain extension abutting the gate structure at a second vertical gate edge on a second side of the gate dielectric opposite the first side of the gate dielectric;

wherein the separation of the shallow source and drain implants from the gate dielectric is adjustable and controllable by the gate structure in conjunction with the sacrificial spacer deposition before the implants;

wherein the source extension and drain extension are doped epitaxial layers of semiconducting material having a crystalline structure of the semiconductor substate or well; and wherein the interfaces between the gate dielectric and the substrate, the source extension and the substrate and the drain extension and the substrate or well are all coplanar on the surface of the substrate or well.

6. The advanced Low Electrostatic Field transistor of claim 5, wherein the substrate or well has a doping of a first type and the source and drain and the selective epitaxial source and the selective epitaxial drain extensions all have doping of a second type.

7. The advanced Low Electrostatic Field transistor of claim 5, wherein the conductive gate material is metallic in nature or semiconductor in nature.

8. The advanced Low Electrostatic Field transistor of claim 5, wherein the selective epitaxial source and the selective epitaxial drain extensions are deposited by a low temperature selective epitaxial process.

9. The advanced Low Electrostatic Field transistor of claim 5, wherein the low temperature selective source and the low temperature selective drain extensions have a crystal structure that is continuous with that of the semiconductor substrate or well.

10. The transistor structure of claim 7, wherein the temperature of deposition of the selective epitaxial process is between 350 and 650 degrees centigrade.

11. The advanced Low Electrostatic Field transistor of claim 9 wherein there is negligible penetration of the low temperature selective epitaxial source extension and the low temperature selective epitaxial drain extension dopants into the surface of the substrate or the well due to the low temperature of deposition of the selective epitaxial process.

12. The advanced Low Electrostatic Field transistor of claim 9, wherein there is negligible penetration or diffusion of the dopant from the shallow source, the selective epitaxial source extension, the shallow drain and the selective epitaxial drain extension due to the low temperatures of the selective epitaxial processes.

13. The advanced Low Electrostatic Field transistor of claim 5, wherein the protective dielectric that separates the selective epitaxial source extension and the of the selective epitaxial drain extension from the gate electrode is thicker than the gate dielectric thickness.

14. The transistor structure of claim 5, wherein a silicide is formed on top of the low temperature selective epitaxial source over the shallow implanted source and on the top of the low temperature selective epitaxial drain over the shallow implanted drain enable good contact to the shallow implanted source and the shallow implanted drain of the advanced Low Electrostatic Field Transistor.

15. The transistor structure of claim 5 wherein the electrostatic fields perpendicular to the plane of the gate-dielectric to the substrate interface are less than $5 \times 10^5$ volts/cm over more than 50% of the channel area under all operating conditions.

16. The transistor structure of claim 5, wherein the semiconductor substrate has a conventionally doped well.

17. The transistor structure of claim 5, wherein the semiconductor substrate has a well with a doping that is retrograde in nature.

18. The transistor structure of claim 4, wherein the semiconductor substrate comprises a slightly doped surface layer that is an epitaxial layer deposited over the substrate.

19. The transistor structure of claim 4, in which the semiconductor substrate is a silicon over an insulator substrate.

* * * * *